US009524362B2

(12) United States Patent
Wang et al.

(10) Patent No.: US 9,524,362 B2
(45) Date of Patent: Dec. 20, 2016

(54) METHOD OF DECOMPOSING LAYOUT FOR GENERATING PATTERNS ON PHOTOMASKS

(71) Applicant: UNITED MICROELECTRONICS CORP., Hsin-Chu (TW)

(72) Inventors: Harn-Jiunn Wang, Kaohsiung (TW); Kuei-Chun Hung, Hsinchu (TW); Chih-Hsien Tang, Taipei (TW); Chin-Lung Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 27 days.

(21) Appl. No.: 14/692,723

(22) Filed: Apr. 21, 2015

(65) Prior Publication Data
US 2016/0314233 A1 Oct. 27, 2016

(51) Int. Cl.
*G06F 17/50* (2006.01)

(52) U.S. Cl.
CPC ............... *G06F 17/5068* (2013.01)

(58) Field of Classification Search
CPC ............ H01L 21/76811; H01L 21/0274; H01L 21/0332; H01L 21/0338; H01L 21/32139; H01L 21/768; H01L 23/528; G03F 1/70; G03F 7/70433; G03F 7/70633; G03F 17/5068; G03F 17/5072
See application file for complete search history.

(56) References Cited

U.S. PATENT DOCUMENTS

| 2009/0040536 | A1* | 2/2009 | Chiu | G03B 27/42 356/620 |
| 2013/0157178 | A1* | 6/2013 | Tsai | G03F 1/70 430/5 |
| 2014/0051016 | A1* | 2/2014 | Chiou | G03F 1/22 430/5 |
| 2014/0264932 | A1* | 9/2014 | Ting | H01L 21/76898 257/774 |
| 2014/0359544 | A1 | 12/2014 | Hsu | |

(Continued)

OTHER PUBLICATIONS

Tung, Title of Invention: Method of Decomposing Layout Design for Preparing Photomask Set Printed Onto Wafer by Photolithography, Method of Forming Photomask Set and Method of Fabricating Integrated Circuit, U.S. Appl. No. 14/534,190, filed Nov. 6, 2014.

*Primary Examiner* — Nha Nguyen
(74) *Attorney, Agent, or Firm* — Winston Hsu; Scott Margo

(57) ABSTRACT

A method of decomposing pattern layout for generating patterns on photomasks is disclosed. The method includes decomposing features of an integrated circuit layout into discrete patterns based on the relation between these features. The features include first features and second features. The first features are then classified into a first feature pattern and a second feature pattern, and the second features are classified into third, fourth, fifth and sixth feature patterns. The spacings of the second features in the fifth and sixth feature patterns are greater than a minimum exposure limits. Finally, the first feature pattern is outputted to a first photomask, the second feature pattern is outputted to a second photomask, the third and fifth feature patterns are outputted to a third photomask, and the fourth and sixth feature patterns are outputted to a fourth photomask.

14 Claims, 10 Drawing Sheets

(56) References Cited

U.S. PATENT DOCUMENTS

| | | | |
|---|---|---|---|
| 2014/0363969 A1* | 12/2014 | Chen | H01L 21/76811 438/636 |
| 2015/0011022 A1* | 1/2015 | Lee | G03F 1/84 438/5 |
| 2015/0040091 A1* | 2/2015 | Hamouda | G06F 17/5072 716/119 |
| 2015/0048479 A1* | 2/2015 | Bao | H01L 23/5256 257/529 |

* cited by examiner

US 9,524,362 B2

1

METHOD OF DECOMPOSING LAYOUT FOR GENERATING PATTERNS ON PHOTOMASKS

BACKGROUND OF THE INVENTION

1. Field of the Invention

This invention relates generally to the field of photolithography and, more particularly, to a method of decomposing layout for generating patterns on photomasks.

2. Description of the Prior Art

An integrated circuit (IC) is a device, such as a semiconductor device, or an electronic system that includes many electronic components, such as transistors, resistors and diodes. These components are often interconnected to form multiple circuit components, e.g. gates, cells, memory units, arithmetic units, controllers and decoders. An IC includes multiple layers of wiring that interconnects the electronic and circuit components. Design engineers design ICs by transforming logical or circuit descriptions of the components into geometric descriptions, which are called design layouts.

Generally, fabrication foundries (fabs) use photolithographic processes to transfer a integrated circuit layout in the form of an electronic file to layers of photoresist on a semiconductor substrate. Specifically, photolithography is an optical printing and fabrication process by which patterns on a photolithographic mask (i.e. a photomask) are imaged and defined onto a photosensitive layer coated on a semiconductor substrate. To fabricate an IC, photomasks with certain patterns are created by using the IC design layout as a template. The patterns on the photomasks can be used to define the positions and contours of parts of the IC. That is to say, the various geometries (features) on the photomasks correspond to various functional circuit components such as transistors, interconnect wiring and via pads, as well as other non-functional elements which are used to facilitate, enhance or track various manufacturing processes. Through a series of photolithographic processes, a large number of functional parts of the devices may be built up to form the overall IC.

Constraining factors in traditional photolithographic processes limit their effectiveness as circuit complexity continues to increase and transistor designs become more advanced and ever smaller in size. Some constraining factors are the lights/optics used within the photolithographic processing systems. Specifically, the lights/optics are band limited due to physical limitations (e.g. wavelength and aperture) of the photolithographic process. The photolithographic process therefore cannot print beyond a certain pitch and distance, and also suffers from other physical manufacturing constraints.

It is understood that a pitch is the sum of the width of a feature and the spacing between two adjacent features, and the smallest size of the features printed on a wafer is severely affected by the pitch. With the advance in ultra-deep submicron technology, the features with small sizes and small pitches are unable to be successfully transferred to a semiconductor substrate. In addition, there are also several difficulties in the use of advanced photolithographic processes such as extreme ultra violet (EUV). Current lithography technology is expected to be used for next generation silicon technology. To overcome the difficulty in printing the features with small pitches, a new photolithographic process, i.e. multiple patterning lithography, is created which is recognized as a promising solution for 32 nm, 22 nm and sub-22 nm volume IC production. Generally, a single layer of a layout pattern is decomposed into multiple patterns, which are respectively fabricated on discrete photomasks. In the subsequent photolithographic process, the multiple patterns on discrete photomasks may be transferred to a single photoresist layer on the semiconductor substrate by applying multiple exposures.

However, there are still several drawbacks needing to be overcome even if the multiple patterning lithography is applied. For example, overlay errors between two adjacent layers on the semiconductor substrate are even worsened when the patterns in a single layer on the semiconductor substrate is formed by more than two exposure processes. Therefore, there is still a need to provide a method to overcome the above-mentioned drawbacks.

SUMMARY OF THE INVENTION

According to one embodiment of the present invention, a method of decomposing pattern layout for generating patterns on photomasks is disclosed and includes the following steps. First, an integrated circuit layout including first features and second features are provided. The first features are then classified into a first feature pattern and a second feature pattern, and the second features are classified into a third feature pattern and a fourth feature pattern. The second features in the third feature pattern can overlap the first features in the first feature pattern, and the second features in the fourth feature pattern can overlap first features in the second feature pattern. The spacings of the second features in the fourth feature pattern are then checked. The portions of second features in the fourth feature pattern are further classified into a fifth feature pattern and a sixth feature pattern when the spacings of the portions in the second features are less than a minimum exposure limits. Finally, the first feature pattern is outputted to a first photomask, the second feature pattern is outputted to a second photomask, the third and fifth feature patterns are outputted to a third photomask, and the fourth and sixth feature patterns are outputted to a fourth photomask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
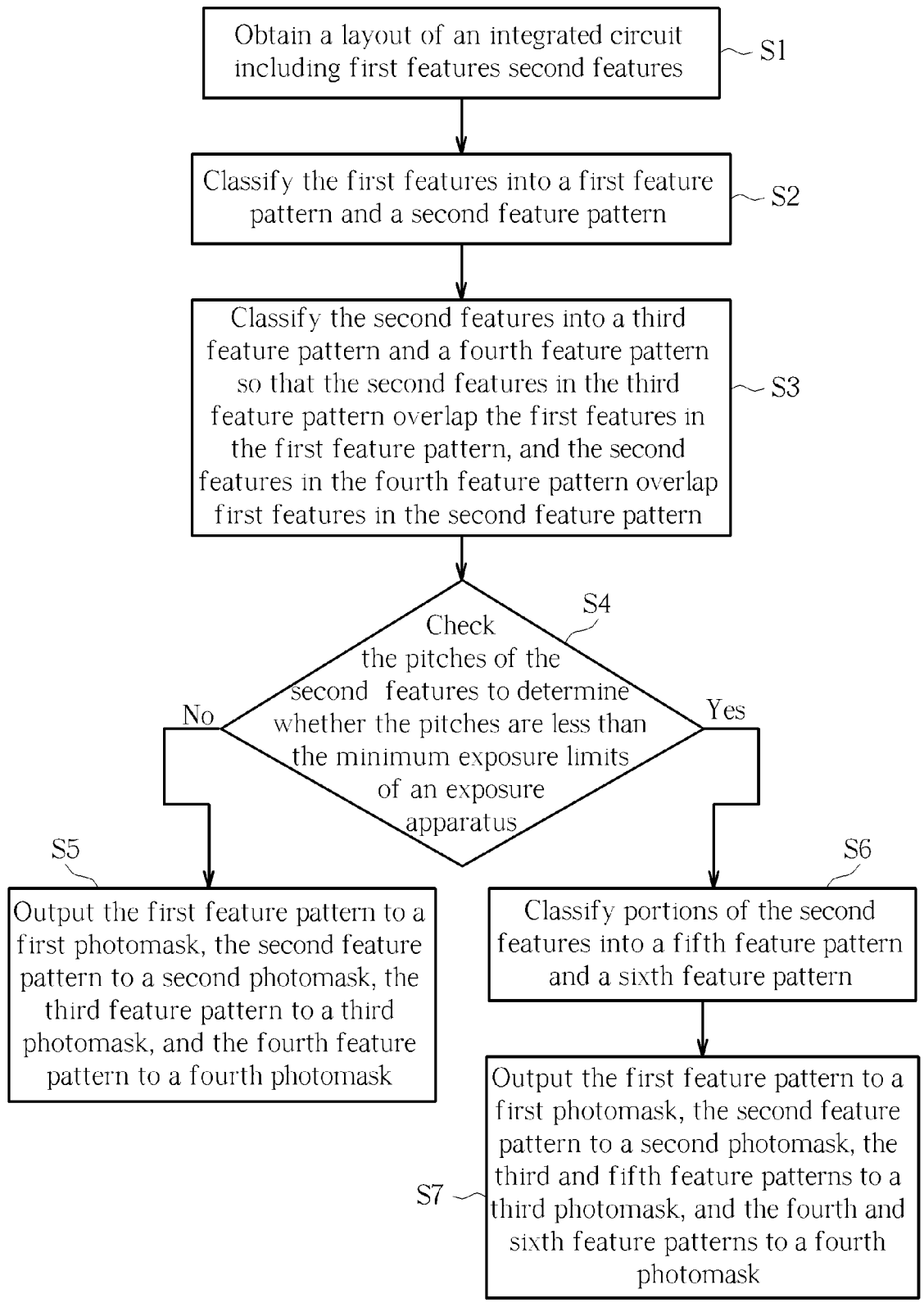
FIG. 1 schematically depicts a flow chart of a method of decomposing layout for generating patterns on photomasks according to an embodiment of the present invention.

In the following description, numerous specific details are given to provide a thorough understanding of the invention.

It will, however, be apparent to one skilled in the art (note: of ordinary skill in the art) that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

FIG. 1 illustrates a flow chart of a method for decomposing layout for generating patterns on photomasks according to an embodiment of the present invention. FIG. 2 to FIG. 7 schematically depict top views of a method for decomposing layout for preparing a photomask set according to an embodiment of the present invention. Preferably, dense parts of an integrated circuit layout may first be selected or marked in order to save processing time and processing cost. Accordingly, steps disclosed in the following paragraphs may only be performed for these dense parts instead of being performed on the entire integrated circuit layout.

Figure 2:
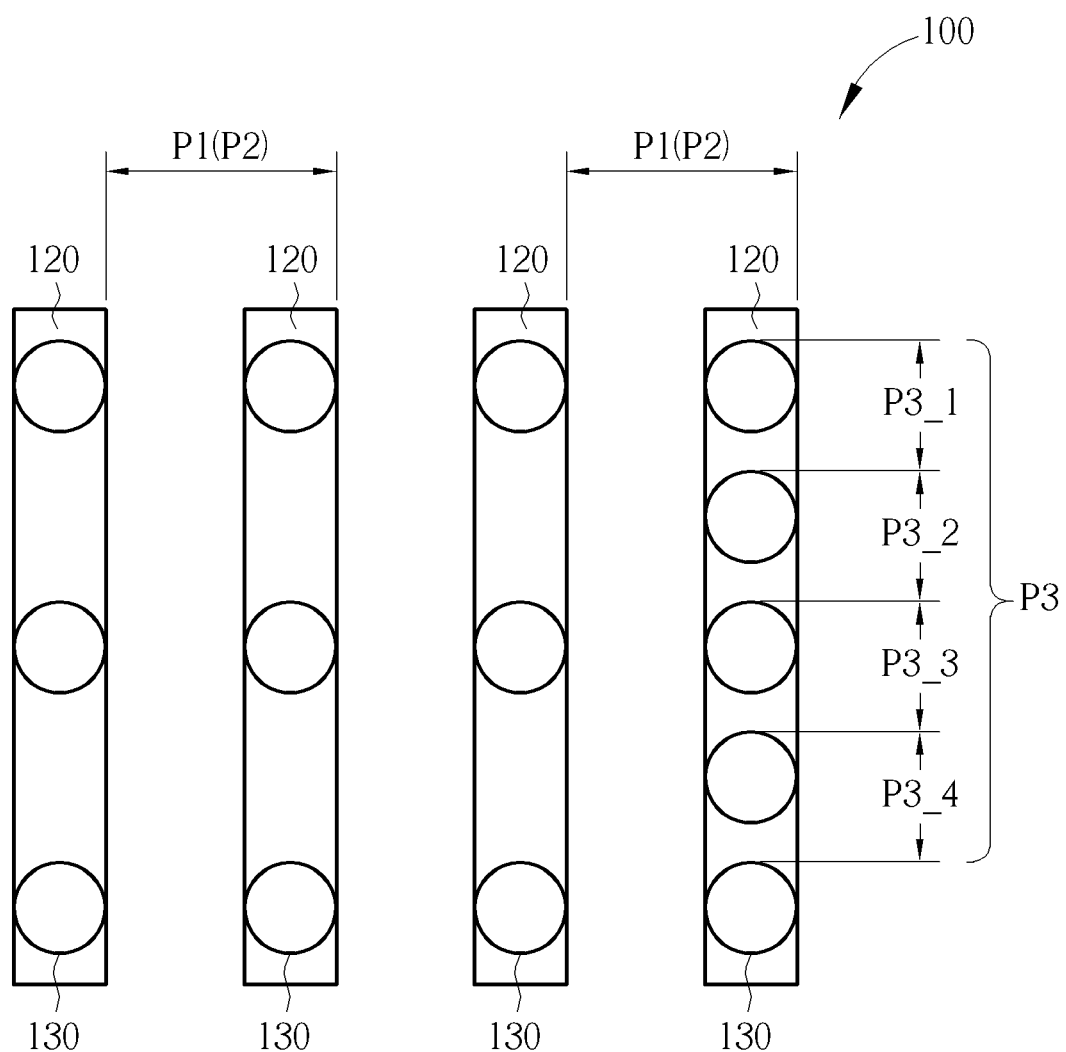
FIG. 2 to FIG. 5 schematically depict top views of a method of decomposing layout for generating patterns on photomasks according to an embodiment of the present invention.

Please refer to FIG. 2. In step S1, portions of an integrated circuit layout 100 including first features 120 and second features 130 are received or obtained by a computer system and stored in a computer readable storage medium. These features 120 and 130 may be stored as two circuit layout files and used to define the contours and locations of parts of electronic devices in an IC. For example, the first features 120 may be used to define the contours and locations of interconnection lines or gate lines of field effect transistors, and the second features 130 may be used to define the contours and locations of vias or electrical contacts of field effect transistors. Although the shape of each first feature 120 and each second feature 140 shown in FIG. 2 is rectangular and circular respectively, it is understood that the shapes of these features 120 and 130 are for illustrative purpose and may be modified or corrected according to different requirements.

More precisely, all the first features 120 are printed in the same layer on the semiconductor substrate while all the second features 130 are printed in another layer above or underneath the layer printed with the first features 120. According to this embodiment, each of the second features 130 may overlap the corresponding first features 120 completely. Also, the first features 120 may be arranged with a pitch P1 while the second features 130 are arranged with pitches P2 and P3. Preferably, the pitch P3 is less than pitches P1 and/or P2. It should be noted that, the first features 120 may be distributed with unequal pitches according to another embodiment of the present invention.

Figure 3:
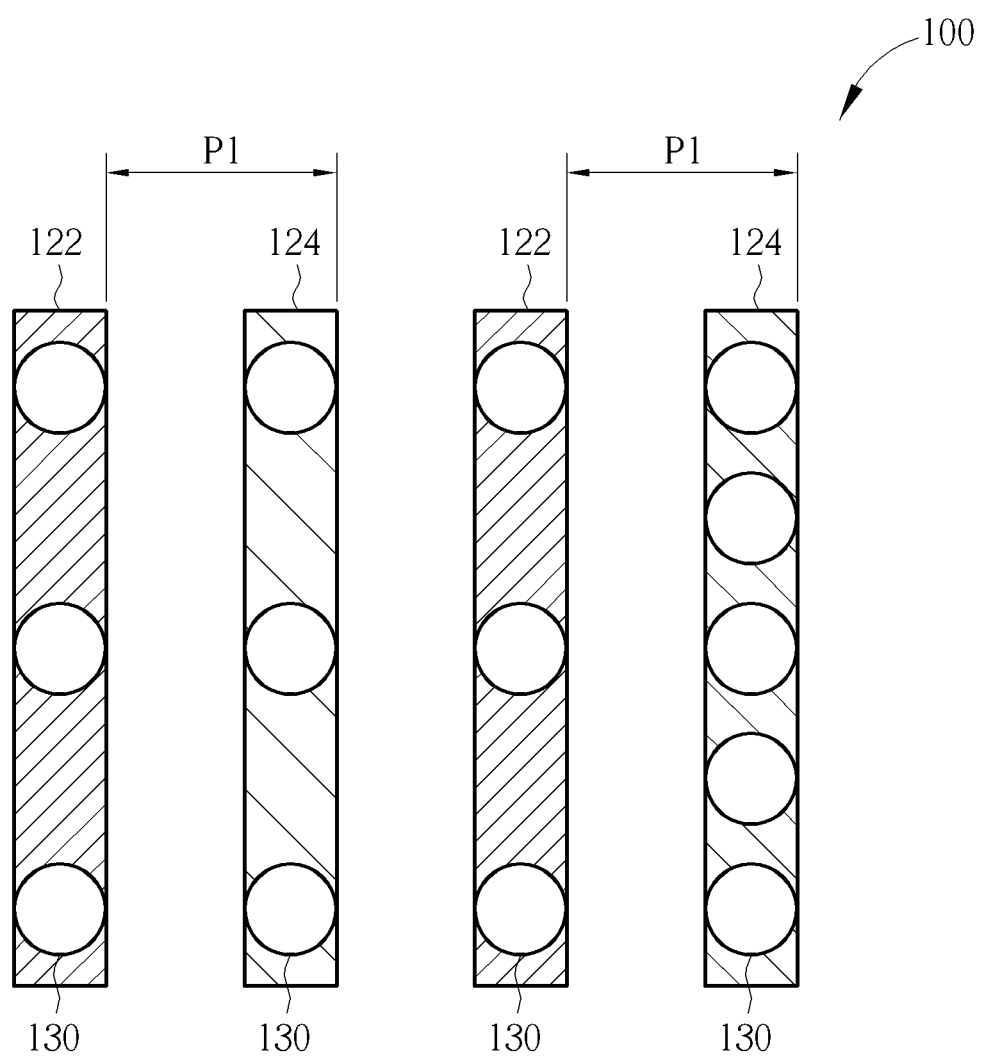

Please refer to FIG. 3. In step S2, the first features 120 are classified into a first feature pattern 122 and a second feature pattern 124 based on the pitches P1 of the two adjacent first features 120. The purpose of classifying the first features 120 into two patterns is to increase the pitches between two adjacent features 120. Therefore, the features with greater pitches may be transferred to a layer on the semiconductor substrate more successfully in the subsequent photolithographic processes.

Figure 4:
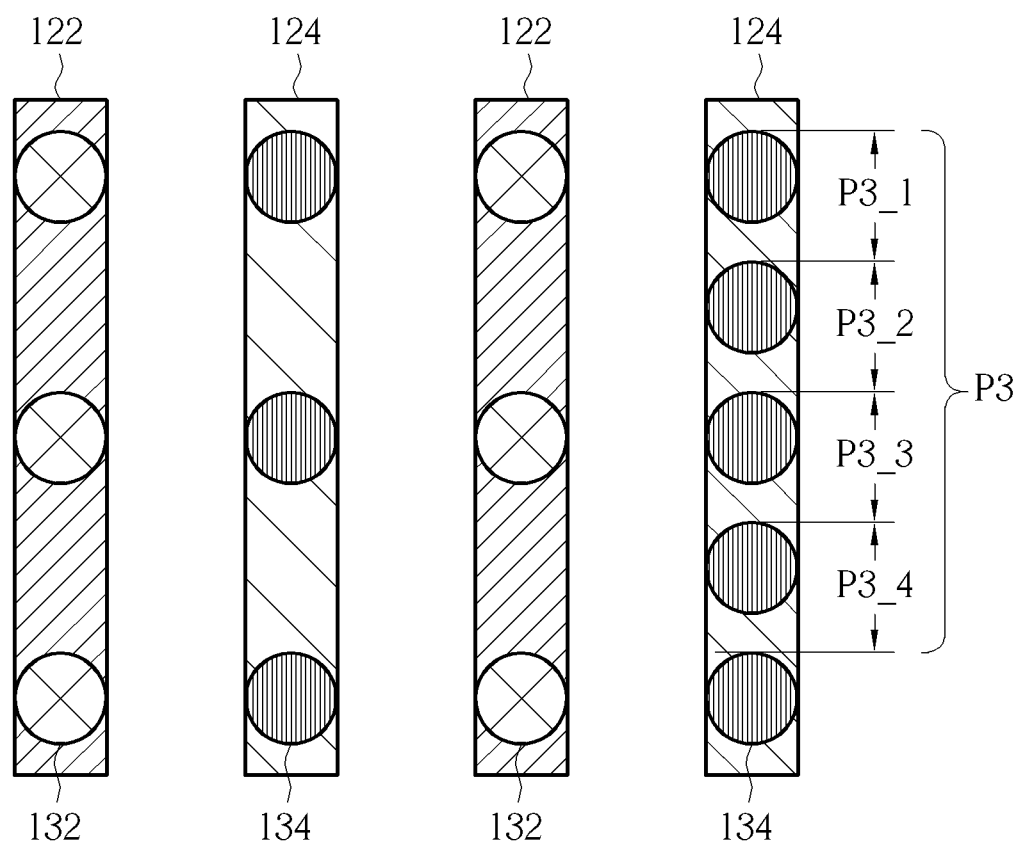

Please refer to FIG. 4. In step S3, the second features 130 are then classified to a third feature pattern 132 and a fourth feature pattern 134. Specifically, the second features 130 of the third feature pattern 132 may overlap the first features 120 of the first feature pattern 122 while the second features 130 of the fourth feature pattern 134 may overlap the first features 120 of the second feature pattern 124. That is to say, the second features 130 are classified based on the location of the first feature pattern 122 and the second feature pattern 124. Also, the first and second features 120 and 130 may be classified based on an overlay tolerance in a process of manufacturing an integrated circuit layout on a semiconductor substrate.

Figure 5:
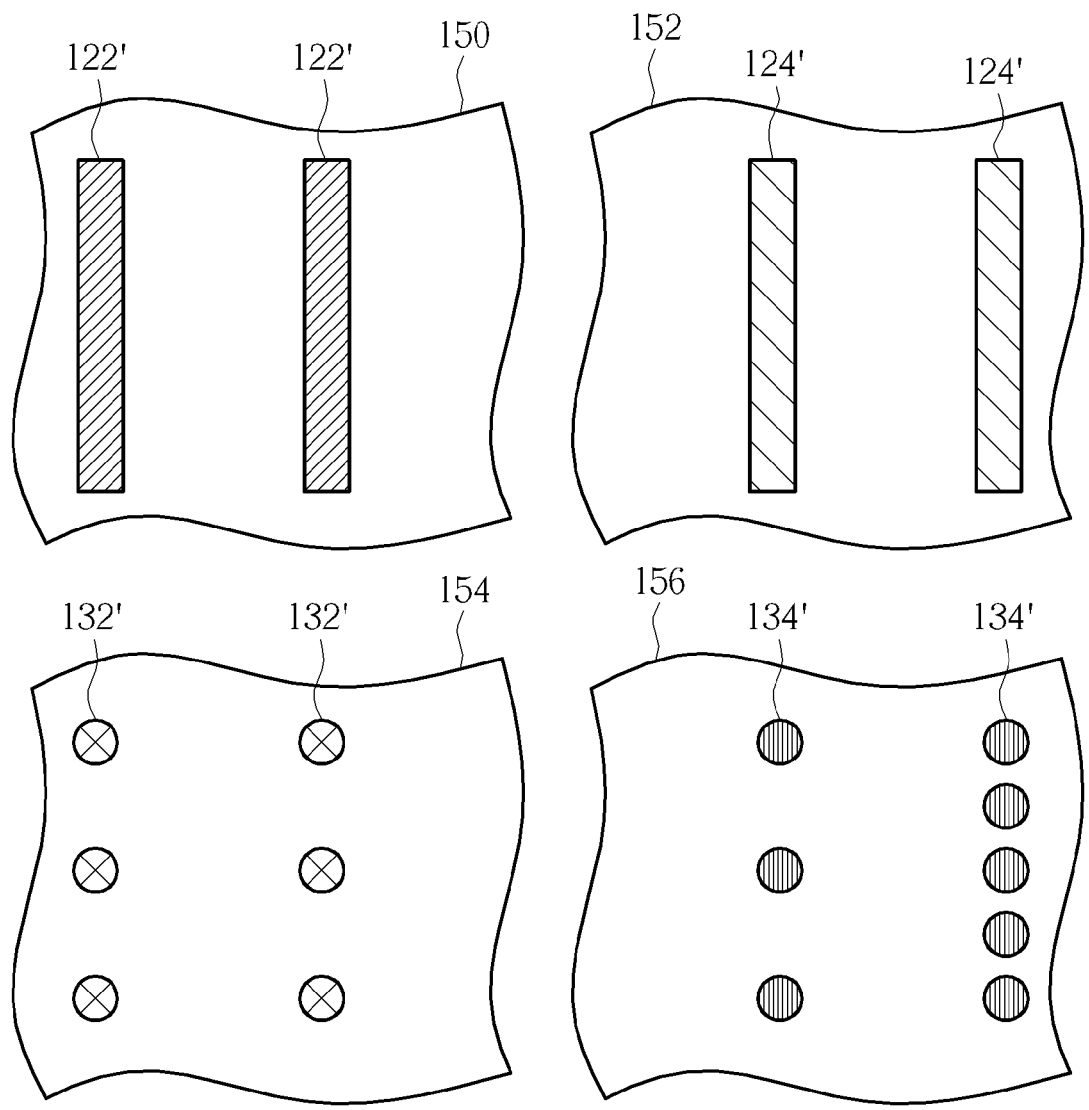

Then, in step S4, the pitches of the first feature pattern 122 and the second feature pattern 124 are checked to determine whether there are any features with pitches less than the minimum exposure limit of the corresponding exposure system. In this case, if all of the pitches of the features, especially the pitch P3 of the fourth feature pattern 134, are greater than the minimum exposure limit, the first, second, third, and fourth feature patterns 122, 124, 132, and 134 are then decomposed into four separate patterns and stored in different electronic files. Afterwards, these electronic files may be transmitted to an apparatus for manufacturing photomasks. The photomasks with the first, second, third, and fourth feature patterns are shown in FIG. 5, and there are at least two sets of photomasks, i.e. a first set of photomasks 150 and 152 and a second set of photomasks 154 and 156. Specifically, as shown in FIG. 5, the photomasks 150 and 152 respectively include a first feature pattern 122' and a second feature pattern 124', these patterns which may be transferred to the same layer on a semiconductor substrate in the following photolithographic processes, and the photomasks 154 and 156 respectively include a third feature pattern 132' and a fourth feature pattern 134', these patterns which may also be transferred to another layer on the semiconductor substrate in other photolithographic processes. It should be noted that the locations and contours of features in the feature patterns 122', 124', 132', and 134' on the photomasks 150, 152, 154, and 156 are defined by the feature patterns 122, 124, 132, and 134 in the form of electronic files. In addition, the contours of the features in the feature patterns 122', 124', 132', and 134' may be slightly deviated from those of the original features 120 and 130 when additional simulation process such as optical proximity correction (OPC) process is performed.

By decomposing the integrated circuit layout 100 into the first feature pattern 122' on the first photomask 150, the second feature pattern 124' on the second photomask 152, the third feature pattern 132' on the third photomask 154, and the fourth feature pattern 134' on the fourth photomask 156, the overlay accuracy of the corresponding features fabricated on the semiconductor substrate can be improved. This characteristic is disclosed in the following paragraphs.

Figure 6:
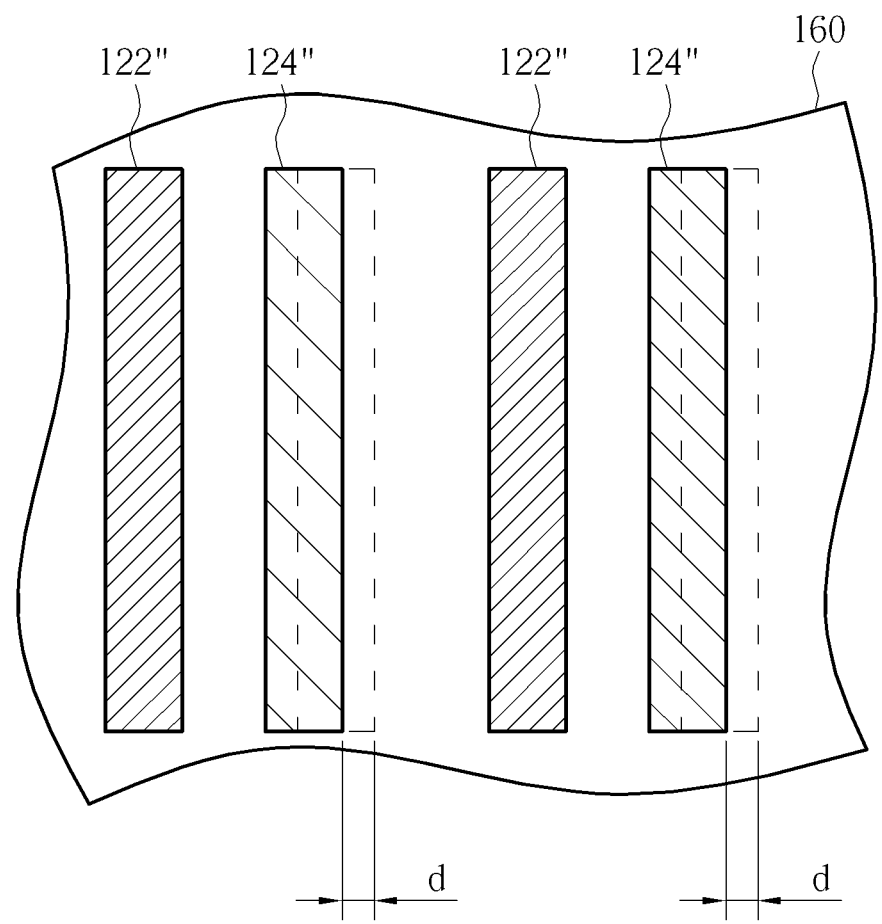
FIGS. 6 and 7 schematically depict top views of a method of fabricating an integrated circuit on a semiconductor substrate by the photomask set shown in FIG. 5.
Figure 7:
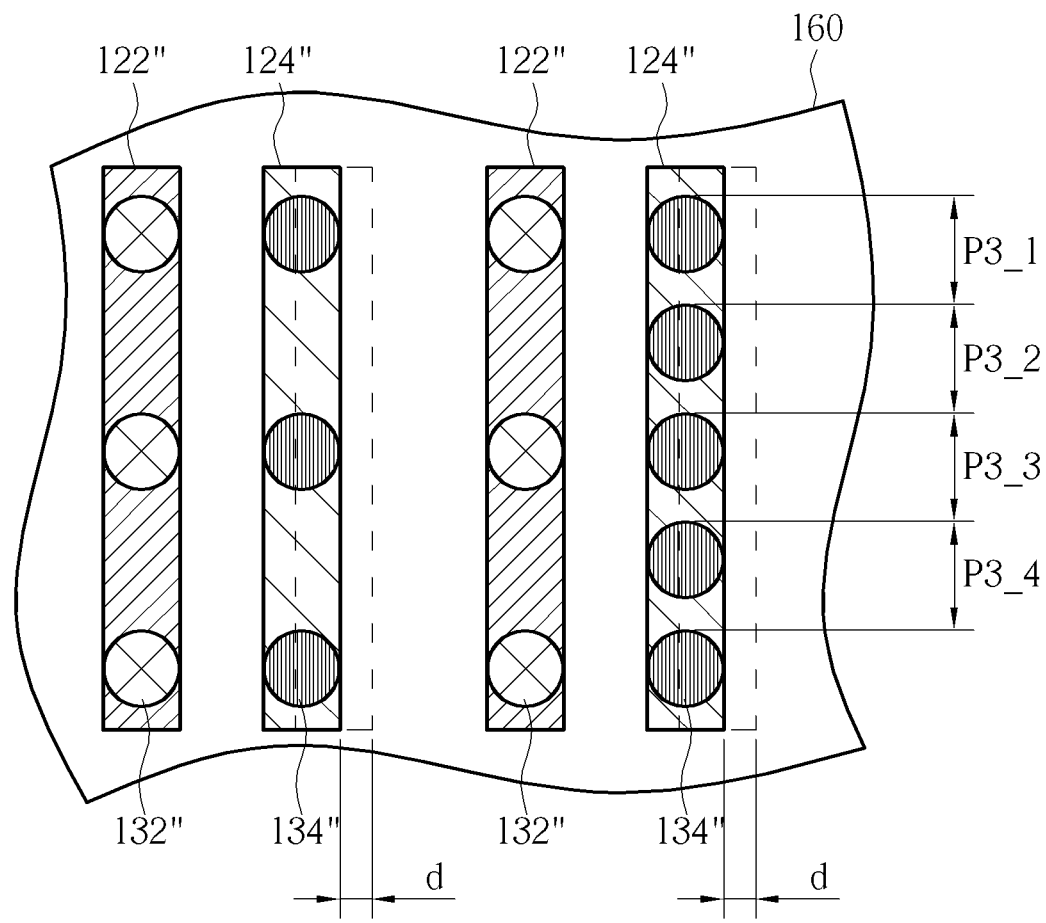

FIG. 6 and FIG. 7 are schematic top views showing a method of fabricating an integrated circuit on a semiconductor substrate by applying the photomask set of FIG. 5. As shown in FIG. 6, a first pattern 122" and a second pattern 124" are formed on a semiconductor substrate 160 through double-patterning processes. Specifically, these patterns 122" and 124" are formed by transferring the first pattern 122' on the first photomask 150 and the second pattern 124' on the second photomask 152 to the same layer on the semiconductor substrate 160. However, because of the misalignment during the photolithographic processes, the real position of the second pattern 124" may be slightly deviated from its ideal position as defined in the electronic file. In this case, the second pattern 124" is shifted toward the first pattern 122" by a distance d, but is not limited thereto.

As shown in FIG. 7, the position of the third feature pattern 132' on the third photomask 154 may align the position of the first feature pattern 122" on the semiconductor substrate 160 during a photolithographic process, and the third feature pattern 132' is then transferred onto the semiconductor substrate 160 to form a third feature pattern 132". In this way, the third feature pattern 132" may perfectly align the first feature pattern 122". Analogously, the fourth feature pattern 134" is also formed on the second feature pattern 124" by another suitable photolithographic process. It should be noted that the position of the fourth feature pattern 134" may be adjusted by shifting the fourth photomask 156 based on the location of the second feature pattern 122" on the semiconductor substrate 160. Specifically, because the position of the fourth feature pattern 134" may be adjusted by considering the location of the second feature pattern 124" without considering the location of the first feature pattern 122", the alignment accuracy between the fourth feature pattern 134" and the second feature pattern 124" can be improved.

By applying the method described above, the third feature pattern 132" and the fourth feature pattern 134" can overlap the first feature pattern 122" and the second feature pattern 124" perfectly even though the second feature pattern 124" slightly shifts from its ideal position.

According to this embodiment, the first feature pattern 122" and the second feature pattern 124" are interconnect patterns, while the third feature pattern 132" and the fourth feature pattern 134" are via patterns. In another embodiment, the first feature pattern 122" and the second feature pattern 124" may be polysilicon gate patterns, while the third feature pattern 132" and the fourth feature pattern 134" may be contact patterns, but this depends upon practical requirements.

According to the method disclosed in the above paragraphs, the overlay accuracy can be improved effectively. However, this method still has some drawbacks and needs to be improved further. For example, as shown in FIG. 7, when the pitches P3_1, P3-2 to P3_4 of the fourth feature pattern 134" are less than a certain value such as the minimum exposure limit, some of the fourth feature patterns 134" on the semiconductor substrate 160 may be merged, which leads to the malfunction of the corresponding semiconductor devices.

Figure 8:
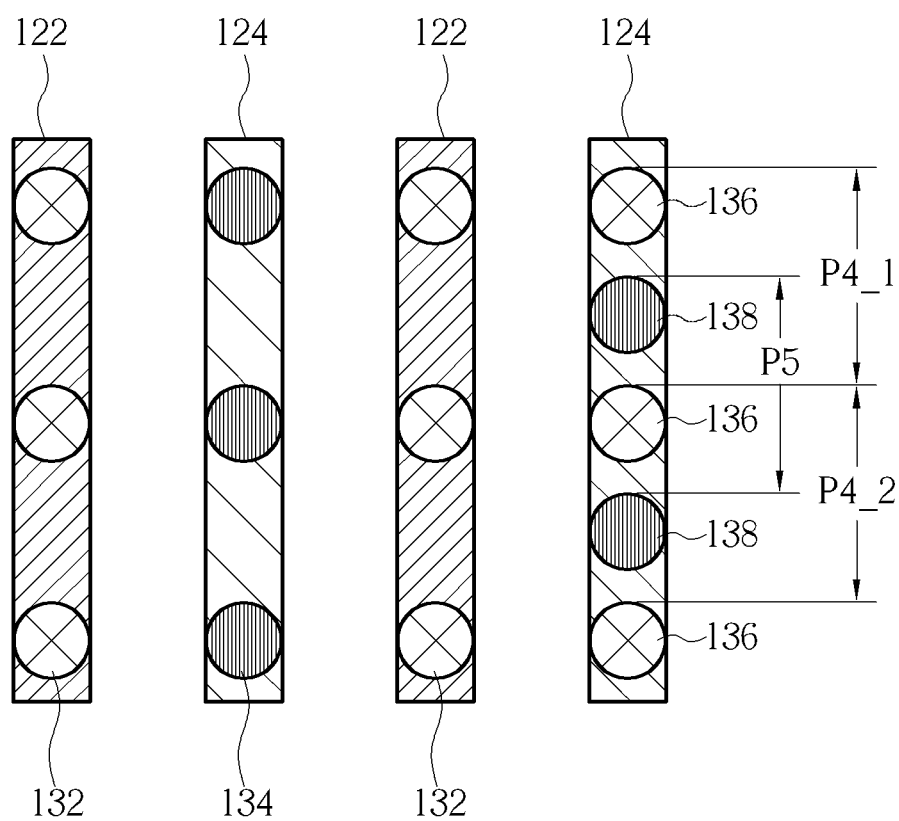
FIG. 8 and FIG. 9 schematically depict top views of a method of decomposing layout for generating patterns on photomasks according to another embodiment of the present invention.

Accordingly, referring to FIG. 4 and FIG. 8, when the pitches P3 of the fourth feature pattern 134 stored in the form of an electronic file are less than a certain value, step S6 is carried out to further classify portions of the second features 134 into a fifth feature pattern 136 and a sixth feature pattern 138. The fifth feature pattern 136 and the sixth feature pattern 138 are respectively distributed with pitches P4_1 and P4_2 and P5 which are greater than the pitch P3 of the fourth feature pattern 134. Then, the first, second, third, fourth, fifth, and sixth feature patterns 122, 124, 132, 134, 136, and 138 are decomposed into four separate patterns and stored in different electronic files.

Figure 9:
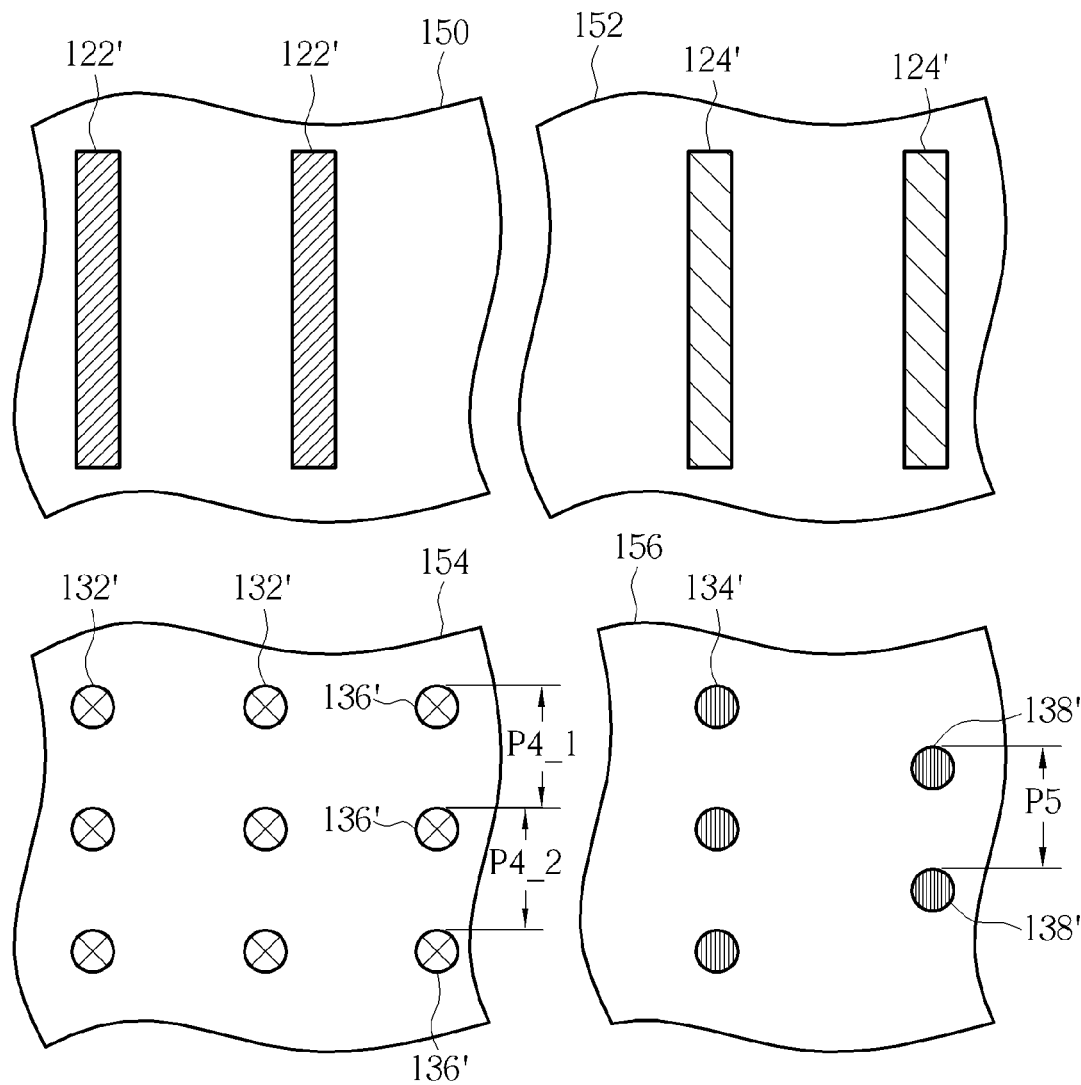

Afterwards, these electronic files may be transmitted to an apparatus for manufacturing photomasks. The photomasks with the first, second, third, fourth, fifth, and sixth feature patterns are shown in FIG. 9. Specifically, as shown in FIG. 9, a first feature pattern 122' is fabricated on a first photomask 150, the second feature pattern 124' is fabricated on a second photomask 152, the third and fifth feature patterns 132' and 136' are fabricated on a third photomask 154, and the fourth and sixth feature patterns 134' and 138' are fabricated on a fourth photomask 156. It should be noted that the locations and contours of the features in the feature patterns 122', 124', 132', 134', 136' and 138' on the photomasks 150, 152, 154, and 156 are defined by the feature patterns 122, 124, 132, 134, 136 and 138 in the form of electronic files. In addition, the contours of the features in the feature patterns 122', 124', 132', 134', 136' and 138' may be slightly deviated from the original features 120 and 130 when additional simulation process such as optical proximity correction (OPC) process is performed.

Figure 10:
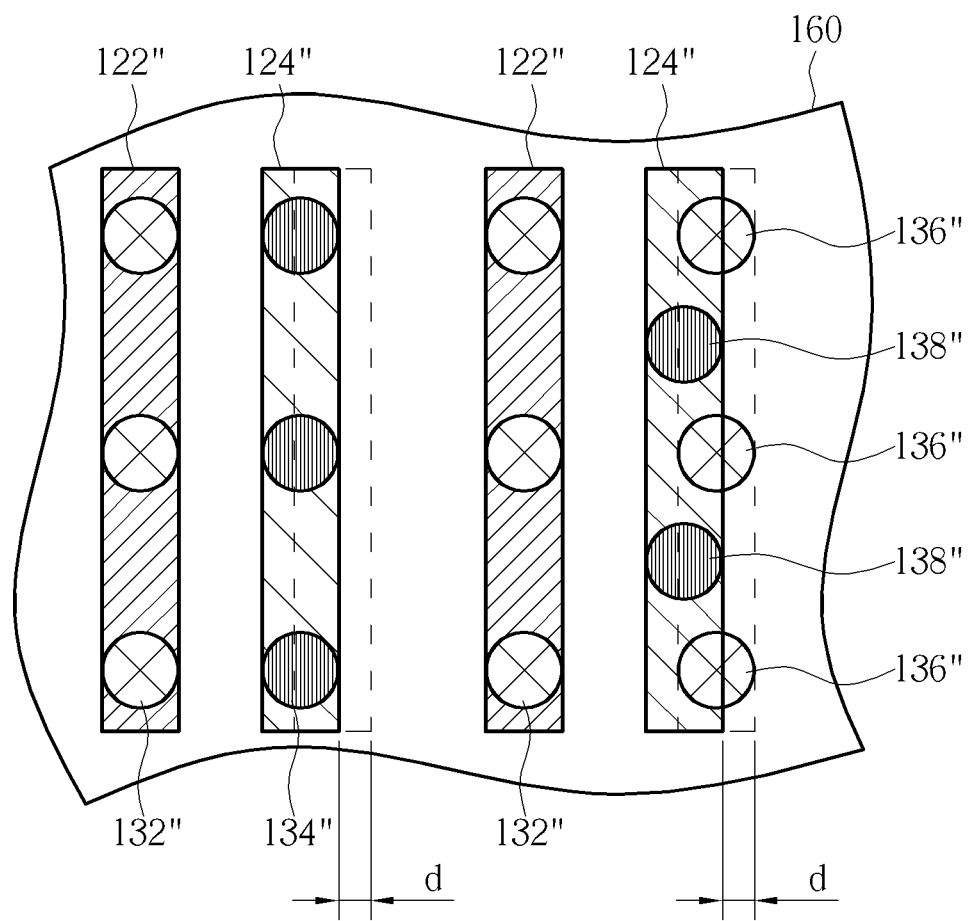
FIG. 10 schematically depicts top views of a method of fabricating an integrated circuit on a semiconductor substrate by the photomask set shown in FIG. 9.

FIG. 10 is a schematic top view showing a method of fabricating an integrated circuit by applying the photomask set shown in FIG. 9. As shown in FIG. 10, a first pattern 122" and a second pattern 124" are formed on a semiconductor substrate 160 through double-patterning processes. Specifically, these patterns 122' and 124" are formed by transferring the first pattern 122' on the first photomask 150 and the second pattern 124' on the second photomask 152 to the same layer on the semiconductor substrate 160. However, because of the misalignment during the photolithographic process, the real position of the second pattern 124" may be slightly deviated from its ideal position defined in the electronic file. In this case, the second pattern 124" is shifted toward the first pattern 122" by a distance d, but is not limited thereto.

Afterwards, the third and fifth feature patterns 132' and 136' on the third photomask 154 is aligned with the first feature pattern 122" on the semiconductor substrate 160, and the third and fifth feature patterns 132" and 136" are then formed on the first and second feature patterns 122" and 124" by a suitable photolithographic and etching process. Similarly, the fourth and sixth feature patterns 134" and 138" are then formed on the second feature pattern 124" by another suitable photolithographic process. It should be noted that the position of the fourth and sixth feature patterns 134" and 138" may be adjusted by shifting the fourth photomask 156 based on the location of the second feature pattern 124" on the semiconductor substrate 160. Specifically, because the position of the fourth and sixth feature pattern 134" and 138" may be adjusted by considering the location of the second feature pattern 124" without considering the location of the first feature pattern 122", the alignment accuracy between the fourth feature pattern 134" and the second feature pattern 124" can be improved. Besides, because the pitches of the fifth feature pattern 136" and the sixth feature pattern 138" are greater than the pitch of the original fourth feature pattern 134", the fifth feature pattern 136" and the sixth feature pattern 138" would not be merged anymore according to this embodiment.

To summarize, the present invention provides a method for decomposing layout for preparing a photomask set based on the overlay relation. These features stored in a computer system can be classified into a first, second, third, and fourth feature patterns. Moreover, the fourth feature pattern may be further classified into the fifth and sixth feature patterns when its pitch is less than the minimum exposure limit. The first feature pattern is fabricated on a first photomask, the second feature pattern is fabricated on a second photomask, the third and fifth feature patterns are fabricated on a third photomask, and the fourth and sixth feature patterns are fabricated on a fourth photomask. Therefore, multiple patterning processes can be applied to scale down an integrated circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of decomposing pattern layout for generating patterns on photomasks, comprising:

transmitting an integrated circuit layout comprising a plurality of first features and a plurality of second features to a computer readable storage medium;

classifying the first features into a first feature pattern and a second feature pattern;

classifying the second features into a third feature pattern and a fourth feature pattern so that the second features in the third feature pattern overlap the first features in the first feature pattern, and the second features in the fourth feature pattern overlap first features in the second feature pattern;

checking pitches of the second features to determine whether the pitches are less than a minimum exposure limit;

classifying portions of second features in the fourth feature pattern into a fifth feature pattern and a sixth feature pattern when the pitches of the second features in the fourth feature pattern are less than a minimum exposure limit; and outputting the first feature pattern to a first photomask, the second feature pattern to a second photomask, the third and fifth feature patterns to a third photomask, and the fourth and sixth feature patterns to a fourth photomask.

2. The method of claim 1, wherein the first features are classified based on a pitch of the first features.

3. The method of claim 1, wherein the second features are classified based on the locations of the first features.

4. The method of claim 1, wherein the first and second features are classified based on an overlay tolerance in a process of manufacturing the integrated circuit layout on a semiconductor substrate.

5. The method of claim 1, wherein the first features are interconnect lines and the second features are vias.

6. The method of claim 1, wherein the first feature pattern and the second feature pattern are to be printed in a same layer on a wafer.

7. The method of claim 6, wherein the third, fourth, fifth and the sixth feature patterns are to be printed in another layer adjacent to the layer on the wafer.

8. The method of claim 1, wherein the first features in the first feature pattern are apart from the first features in the second feature pattern.

9. The method of claim 1, wherein the second features in the third feature pattern are apart from the second features in the fourth feature pattern.

10. The method of claim 9, wherein the second features in the fifth feature pattern are apart from the second features in the sixth feature pattern.

11. The method of claim 1, wherein the second features in the fourth feature pattern have a pitch less than a pitch of the second features in the third feature pattern.

12. The method of claim 1, further comprising transferring patterns on the first, second, third, and fourth photomasks to layers on a semiconductor substrate.

13. The method of claim 12, wherein the patterns on the first and second photomasks are transferred onto a same layer on the semiconductor substrate.

14. The method of claim 13, wherein the patterns on the third and fourth photomasks are transferred onto another layer on the semiconductor substrate.

* * * * *